United States Patent

Pyndiah et al.

[19]

[11] Patent Number: 6,122,763
[45] Date of Patent: *Sep. 19, 2000

[54] PROCESS FOR TRANSMITTING INFORMATION BITS WITH ERROR CORRECTION CODING AND DECODER FOR THE IMPLEMENTATION OF THIS PROCESS

[75] Inventors: Ramesh Pyndiah, Plouzane; Patrick Adde, Brest, both of France

[73] Assignee: France Telecom, Paris, France

[*] Notice: This patent is subject to a terminal disclaimer.

[21] Appl. No.: 08/919,969

[22] Filed: Aug. 28, 1997

[30] Foreign Application Priority Data

Aug. 28, 1996 [FR] France .................................. 96 10520

[51] Int. Cl.$^7$ .................................................. H03M 13/00
[52] U.S. Cl. ......................... 714/755; 714/767; 714/781; 714/793; 700/251
[58] Field of Search ................................ 395/86; 371/42, 371/37.07, 40.11, 37.4, 40.3, 39.1, 43.5, 40.12; 375/340

[56] References Cited

U.S. PATENT DOCUMENTS

| 4,633,470 | 12/1986 | Welch et al. ........................... 371/37 |
| 4,821,268 | 4/1989 | Berlekamp ............................. 371/37 |
| 5,181,207 | 1/1993 | Chapman .............................. 371/37.4 |
| 5,563,897 | 10/1996 | Pyndiah et al. ...................... 371/37.4 |

FOREIGN PATENT DOCUMENTS

| 0 229 698 | 7/1987 | European Pat. Off. . |
| 0229698 | 7/1987 | European Pat. Off. . |
| 0 481 752 A1 | 4/1992 | European Pat. Off. . |
| 0481752 | 4/1992 | European Pat. Off. . |
| 0654910 | 5/1995 | European Pat. Off. . |
| 2095517 | 9/1982 | United Kingdom . |
| 2180966 | 4/1987 | United Kingdom . |

OTHER PUBLICATIONS

R. Pyndiah et al. "Near optimum decoding of product codes" IEEE Globecom. Communication: The Global Bridge, Nov. 28–Dec. 2, 1994, vol. 1, pp. 339–343.

S.D. Bate al. "Error control techniques applicable to HF channels" IEEE Proceedings I. Solid–State & Electron devices, Feb. 1989, vol. 136, No. 1, Part 1, pp. 57–63.

(List continued on next page.)

*Primary Examiner*—William Grant
*Assistant Examiner*—McDieunel Marc
*Attorney, Agent, or Firm*—Marshall, O'Toole, Gerstein, Murray & Borun

[57] ABSTRACT

The bits transmitted are coded according to the product of at least two systematic block codes. Iterative decoding is applied in order to determine, at each code word search step, a data matrix ({R}) and a decision matrix ({D}) used for the following step. The new decision matrix is determined at each step by decoding the lines or columns of the input matrix, and the new data matrix is determined taking into account the correction terms which increase the reliability of the decoding on each iteration. The coding and decoding circuits (17) are rendered programmable by a shortening technique allowing selection of the number k–X of non-redundant information bits per block to be coded. Known values are assigned to the other bits, the positions of which are uniformly distributed according to each dimension of the matrices.

7 Claims, 8 Drawing Sheets

OTHER PUBLICATIONS

J. Lodge et al. "Separable MAP "filters" for the decoding of product and concatenated codes", IEEE International Conference on Communications, Proceedings ICC '93, Geneva, Technical program, Conference record, May 1993, pp. 1740–1743.

C. Berrou et al. "Near Shannon limit error—correcting coding and decoding: turbo–codes" IEEE, Proceedings ICC, May 23, 1993, vol. 1, pp. 1064–1070.

W.J. Blackert et al. "An upper bound on turbo code free distance" IEEE International Conference on Communications. Coverging techologies for tommorow's applications. ICC '96. Conference record, Proceedings of ICC/Supercomm 1996, vol. 2, pp. 957–961.

J. Hagenauer "Rate–compatible punctured convolutional codes (RCPC codes) and their applications" IEEE Transactions on Communications, vol. 36, No. 4, Apr. 1–13, 1988, pp. 389–400.

L.R. Bahl et al. "Optical decoding of linear codes for minimizing symbol error rate" IEEE Transactions on Information Theory, Mar. 1974, pp. 281–284.

S.M. Reddy "Random error and burst correction by iterated codes" IEEE Transactions of Information Theory, Jan. 1972, vol. IT–18, No. 1, pp. 182–185.

S.M. Reddy "On decoding Iterated codes", IEEE Transactions on Information Theory, Sep. 1970, vol. IT–16, No. 5, pp. 624–627.

D. Chase, "A class of algorithms for decoding block codes with channel measurement information", IEEE Transactions on Information Theory, Jan. 1972, vol. IT–18, No.1, pp.170–182.

PROCESS FOR TRANSMITTING INFORMATION BITS WITH ERROR CORRECTION CODING AND DECODER FOR THE IMPLEMENTATION OF THIS PROCESS

BACKGROUND OF THE INVENTION

The present invention relates to a process for transmitting information bits, in which a transmitter executes the following steps:

formation of a first binary matrix from the information bits to be transmitted;

conversion of the first binary matrix into a second binary matrix by application of a systematic block code corresponding to the product of elementary systematic block codes; and transmission of the bits extracted from the second binary matrix towards a channel, and a receiver executes the following steps:

formation of an input matrix from a signal received according to the said channel, the input matrix being of the same size as the second binary matrix, and being comprised of digital samples the signs of which represent respective initial estimations of the bits in the second binary matrix and the absolute values of which respectively measure the confidences associated with the said initial estimations; and iterative decoding of the input matrix including a number m of decoding cycles, each decoding cycle successively comprising code word search steps for each elementary block code used in the product code, in which, at each code word search step, a data matrix and a decision matrix with binary components are received which, before the first search step for the iterative decoding, are respectively constituted by the input matrix and by the matrix the binary components of which correspond to the signs of the input matrix samples, and for the following search step a new decision matrix is produced, the binary components of which represent new respective estimations of the bits of the second binary matrix and a new data matrix the samples of which have absolute values which respectively measure confidences associated with the said new estimations, in which decoded information bits are extracted from the decision matrix produced during the last code word search step, and in which each code word search step includes a division of the data matrix received into data vectors each corresponding to a code word of the elementary code and a corresponding division of the decision matrix received into decision vectors and elementary decodings with soft decisions to respectively process at least certain data vector/decision vector pairs.

On the subject of digital transmission of information (speech, image, data, etc.), a distinction is usually made between source coding and channel coding. Source coding forms the binary representation of the signal to be transmitted. It is normally designed as a function of the nature of the signal to be transmitted. Much effort has been expended in recent years on the subject of source coding in order to reduce the digital rate, while preserving good transmission quality. However, these new source coding techniques require better protection of the bits against perturbations during the transmission. Moreover, the physical and economic limitations of high-frequency components (noise factor, power saturation), as well as regulations on the level of power allowed for transmission limit the range of digital transmission systems.

For this reason much work has been carried out on the subject of channel coding, in particular on the subject of block coding. This type of error-correcting coding consists in adding n–k redundancy bits to k information bits originating from the source coding, and in using these redundancy bits on reception in order to correct certain transmission errors. The ratio R=k/n is called the efficiency of the code, and the coding gain G is defined as the ratio, expressed in decibels, between the energies per information bit Eb which are necessary at the input of the receiver without coding and with coding in order to reach a given binary error rate (BER). A typical objective is to create coders and especially their associated decoders such that: (i) the coding gain G is as high as possible (G>5 dB for BER=$10^{-5}$), (ii) the code efficiency R is as high as possible (R>0.6), and (iii) the complexity of the decoding is as low as possible.

The case of the storage of the digital information may be seen as a particular case of transmission, in which the propagation channel includes a memory where the information remains in more or less long-term storage, the transmitter and the receiver may be the same or not. It will thus be understood that, in general, the notions of channel coding and of associated decoding are applicable to the field of the storage of information in the same way as to transmission, the errors to be corrected then being those due to the reading or to the writing in the memory, to the alteration in the content of the memory or also to communications (remote or not) with the devices for reading and writing in the memory.

It is known to enhance the performances of error-correcting codes by using concatenation techniques. In particular, the technique of product codes, which is more particularly involved with the present invention, makes it possible, from two simple block codes (that is to say having a small minimum Hamming distance d) to obtain a code whose minimum Hamming distance is equal to the product of the Hamming distances of the elementary codes used (see S. M. Reddy: "On decoding iterated codes", IEEE Trans. on Information theory, Vol. IT-16, No. 5, September 1970, pages 624–627).

If a block code with parameters $(n_1, k_1, d_1)$ is designated by $C_1$ and a block code with parameters $(n_2, k_2, d_2)$ is designated by $C_2$, the application of the code which is the product of $C_1$ with $C_2$ consists in ordering the $k_1 \times k_2$ successive information bits in a matrix, and in coding the $k_1$ rows of the matrix by the code $C_2$, then the $n_2$ columns of the resultant matrix by the code $C_1$. The parameters of the product code P are then given by $(n=n_1 \times n_2; k=k_1 \times k_2; d=d_1 \times d_2)$. The efficiency R of the code P is equal to $R_1 \times R_2$. Decoding of the code P according to the maximum likelihood a posteriori (MLP) makes it possible to reach optimal performance. The maximum asymptotic coding gain can then be approximated by the relation $G<10 \log_{10} (R.d)$.

The product code is thus very beneficial, but decoding according to the MLP is generally too complex, except in the case of short block codes.

In their article "Separable MAP filters for the decoding of product and concatenated codes", Proc. ICC' 93, Geneva, Pages 1740–1745, May 1993, J. Lodge et al. proposed an iterative decoding algorithm of the type indicated in the introduction, in which the row vectors and the column vectors extracted from the data matrix are decoded using Bahl's algorithm (see L. R. Bahl et al, "Optimal decoding of linear codes for minimizing symbol error rate", IEEE Trans. on Information Theory, Vol. IT-20, pages 248–287, March 1974) which estimates Log Likelihood Ratios (LLRs) for bits. Bahl's algorithm provides soft decisions expressed by the LLRs, allowing performances close to those of the MLP to be achieved. However, it makes use of a decoding trellis having a number of statuses which grows exponentially as a function of n–k. As a result, while the algorithm of Lodge et al. is suitable for short codes such as, for example, Hamming's code (16,11,3), it proves unusable in practice for codes with a high efficiency such as, for example, the BCH code (63,51,5).

Another process of the type indicated at the beginning was presented in European Patent Application No. 0 654 910, the contents of which are incorporated in the present description.

The latter process can be used to decode all the product codes which are built from codes in linear blocks and for which an algebraic decoder is available. The performances obtained with this process are near optimum (see R. Pyndiah et al.: "Near optimum decoding of product codes", Proc. IEEE GLOBECOM' 94 Conference, Vol. 1/3, November–December 1994, San Francisco, pages 339–343). In fact, it can be used to obtain, for a given product code and in four iterations, a BER equal to $10^{-5}$ for a signal-to-noise ratio in the region of 2.5 dB above the theoretical Shannon limit for the product code in question. Moreover, this process is far less complex and much more reliable than the solution proposed by Lodge et al. It is thus possible to decode very large product codes, with elementary code lengths $n_1$, $n_2$ of up to 256.

In considering the creation of a circuit suitable for carrying out iterative decoding of the type mentioned in the introduction, hereafter called block turbo-code circuit or BTC circuit (see O. Raoul et al., "Architecture and design of a turbodecoder circuit for product codes", Proc. GRETSI' 95 Conference, Vol. 2, September 1995, pages 981–984), it is apparent that the surface area of the circuit can be considerably reduced by using the same elementary decoder to carry out several iterations rather than cascading several elementary decoders. Depending on the envisaged application, the number of iterations will be a function of the elementary decoder's complexity. The less the elementary decoder is complex, the greater the number of iterations, hence the advantage of reducing the complexity of the elementary decoder.

For reasons of economy, it is desirable to have a programmable BTC circuit allowing processing of data blocks of differing sizes with a varying number of redundancy bits. It can thus be envisaged to use the same BTC circuit for different applications, which allows an appreciable saving in terms of development costs.

A principal aim of the present invention is to respond to this requirement by proposing a transmission process for information bits allowing the use of a programmable BTC circuit.

SUMMARY OF THE INVENTION

The invention therefore proposes in a process of the type indicated in the introduction, that the first binary matrix comprises, in addition to the information bits, a set of bits with values a priori known to the receiver, which are distributed in an approximately uniform manner according to each dimension of the first binary matrix, which, after systematic coding, are located in determined positions of the said second binary matrix, and which are not transmitted towards the channel, and that the receiver places in the input matrix, in positions corresponding to the said determined positions of the second binary matrix, samples the signs of which correspond respectively to the a priori known values of the bits of the said set and the absolute values of which are representative of a maximum confidence.

The invention makes use of a technique similar to shortening techniques which are well known in the field of simple block codes. Let n, k and d be the product code parameters, in the form:

$$n = \prod_{i=1}^{L} n_i, \; k = \prod_{i=1}^{L} k_i, \; \text{and } d = \prod_{i=1}^{L} d_i$$

where L is the number of elementary codes the respective parameters of which are ($n_i$, $k_i$, $d_i$) (the case where L=2 is considered below, without limiting generality). k and n are the respective numbers of bits in the "first" and "second" binary matrices.

The invention allows the number of independent information bits contained in the matrix to be adapted to any number k–X less than or equal to k, the receiver decoding circuit being the same whatever the number X of a priori known bits. The positions of these X bits are uniformly distrubted in the first matrix, which allows optimum usage of the performance of the iterative decoding process. On this point, it should be noted that a shortening of one or more codes into elementary blocks would be less advantageous as it would allow less choice in the value of X, and especially as it would lead to certain elementary decodings resulting in no BER gain.

The parameters (n',k',d') of the shortened product code are finally n'=n–X, k'=k–X and d'=d. Its efficiency R' is R'=(k–X)/(n–X)≦k/n.

In an advantageous implementation, another set of Y bits of determined positions in the second binary matrix are not transmitted towards the channel, and the receiver places in the input matrix, in positions corresponding to these Y determined positions of the second binary matrix, samples the absolute values of which are representative of minimum confidence.

A puncturing technique is used here which is similar to those frequently used in the field of convolutional codes. The puncturing increases the efficiency of the code. In the case of convolutional codes, its aim is generally to achieve coding efficiencies in excess of ½ while using binary codes, i.e. those which have the least complex decoding trellis. In general, a punctured convolutional code has distance properties similar to those of a non-punctured code of identical efficiency.

Puncturing, however, is not normally applied to block codes. In fact, there are numerous block codes with high efficiencies having optimum distance properties. It would therefore be expected that puncturing would degrade distance properties without achieving a gain in complexity which would be as appreciable as in the case of convolutional codes. The inventors were surprised to observe that, in the case of a product code, puncturing applied as indicated above, combined with the soft decision iterative decoding process, does not significantly degrade the performance of the codec.

The Y parameter can then be used to program the number of bits per coder output block, and the global coding efficiency. For example, if the programming of the number of non-redundant information bits per block (via the number X) leads to an excessive drop in coding efficiency, a higher efficiency can be achieved if Y>0.

The parameters (n",k",d") of the shortened and punctured product code are finally n"=n−X−Y, k"=k−X and d"=d. Its efficiency R" is R"=(k−X)/(n−X−Y).

The soft decision elementary decoding for processing of a data vector/decision vector pair can in particular be of the type described in EP-A-0 654 910. It then comprises the following steps:

determination of a number p of indexes for which the data vector components are the least reliable;

construction of a number q of binary words to be decoded from the said p indexes and from the decision vector;

obtaining q' code words on the basis of algebraic decodings of the decision vector and the q binary words to be decoded;

selection, from the q' code words obtained, of that having the shortest euclidean distance with the data vector;

calculation of a correction vector, each component $W_j$ of the correction vector being respectively calculated by determining an optional concurrent word having its j-th component different from that of the selected code word, applying the formula:

$$W_j = \left( \frac{|M^c M^d|}{4} C_j^d \cdot R'_j \right) C_j^d$$

when a concurrent word has been determined, $M^d$ and $M^c$ respectively designating the euclidean distances, with respect to the data vector, of the selected code word and of the concurrent word, and $C_j^d$ and $R'_j$ respectively designate the j-th components of the selected code word and of the data vector;

obtaining the new decision vector taken as equal to the said selected code word; and calculation of the new data vector by adding the correction vector multiplied by a first confidence coefficient to the corresponding input vector extracted from the input matrix.

In a preferred implementation, in the calculation step for a correction vector, the determination of an optional concurrent word with respect to the j-th component of the selected code word includes a comparison between the j-th component of the selected code word and that of a candidate code word which, among the q' code words obtained except for the selected code word, has the shortest euclidean distance with the data vector, the said candidate code word being taken as a concurrent word when its j-th component is different from that of the selected code word, and no concurrent word being determined if not.

A second aspect of the invention relates to a programmable redundancy coder, comprising:

means to form a first binary matrix from information bits to be transmitted;

elementary coding means instructed to convert the first binary matrix into a second binary matrix by application of a systematic block code corresponding to the product of elementary systematic block codes; and means to transmit the bits extracted from the second binary matrix towards a channel, the coder also comprising programming means in order to determine, from a number X supplied to program the number of information bits to be included in each first matrix, X positions uniformly distributed according to each dimension of the first matrix, the means for creating the first matrix being designed to place bits of known values in the said X positions, the said bits of known values being located after systematic coding in determined positions of the second binary matrix and not being transmitted towards the channel.

A third aspect of the invention relates to a programmable error correction decoder, comprising:

means for forming an input matrix from a signal received according to a transmission channel, the input matrix being composed by digital samples the signs of which represent respective initial estimations of bits of a binary matrix formed by a redundancy coder applying a systematic block code corresponding to the product of elementary systematic blocks and the absolute values of which respectively measure the confidences associated with the said initial estimations; and iterative decoding means instructed to decode the input matrix according to successive decoding cycles, each decoding cycle successively comprising steps for searching code words for each elementary block code used in the product code, in which, at each code word search step, the decoding means receive a data matrix and a decision matrix with binary components which, before the first search step, are respectively constituted by the input matrix and by a matrix the binary components of which correspond to the signs of the samples of the input matrix, and produce for the following search step a new decision matrix the binary components of which represent respective new estimations of the bits of the second binary matrix and a new data matrix the samples of which have absolute values which respectively measure the confidences associated with the said new estimations, the decoded information bits being extracted from the decision matrix produced during the last code word search step, and in which each code word search step includes a division of the data matrix received into data vectors each corresponding to a code word of the elementary code and a corresponding division of the decision matrix received into decision vectors and elementary decodings with soft decisions to respectively process at least certain data vector/decision vector pairs, the decoder further comprising programming means to determine, from a number X supplied to program the number of decoded information bits to be extracted from the decision matrix, X positions uniformly distributed according to each dimension of a non-redundant sub-matrix of the said binary matrix, the means for forming the input matrix being designed to place, in positions corresponding to the said X positions, digital samples of determined signs and the absolute values of which are representative of maximum confidence.

DESCRIPTION OF THE PREFERRED EMBODIMENTS

The inventors have developed an advantageous variant, providing a good performance/complexity compromise, of the iterative decoding processes for product codes described in EP-A-0 654 910. This variant is described below with reference to FIGS. 1 to 5, before a more specific description of the structure of a product code according to the invention is given. It can be seen on the one hand that the said variant can be applied to the iterative decoding of any type of product code and on the other hand that the transmission process according to the invention is compatible with other iterative decoding methods, such as for example those described in EP-A-0 654 910 or also in the aforementioned article by J. Lodge et al.

Figure 1:
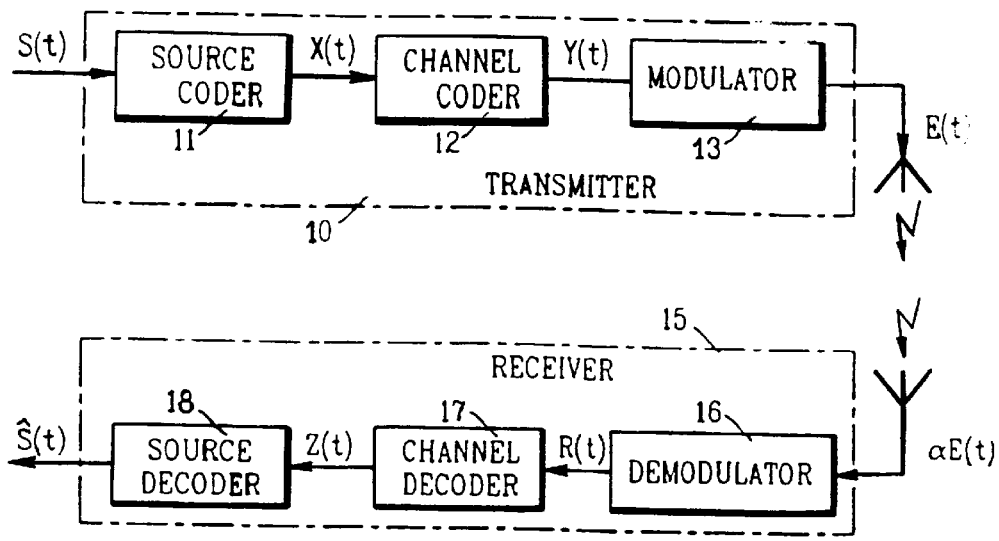
FIG. 1 is a block diagram of a digital transmission chain which can be used to implement the process according to the invention.

In the transmission chain illustrated in FIG. 1, the information bits to be transmitted $a_j$ are contained in a signal $$X(t) = \sum_j a_j h(t - jT)$$

addressed in input to the channel coder 12 of the transmitter 10. This signal $X(t)$ is formed by the source coder 11 from an analog signal $S(t)$. The source coder 11 is conventionally such that the $a_j$s are independent and take the value 0 or 1 with equal probability. $h(t)$ designates a time gate of duration T which is the time interval separating two successive bits. The channel coder 12 applies block coding to produce a signal $$Y(t) = \sum_j c_j h(t - jT')$$

where the $c_j$ are the coded bits and T' is the time interval separating two coded bits (T'<T). The modulator 13 converts the sequence $Y(t)$ into signal sequences which are compatible with the propagation channel. In the case of two-state phase shift keying associated with a radio channel, an example of the signal sent is given by:

$$E(t) = \sum_j e_j h(t - jT_s) \sin(2\pi f_0 t)$$

where $f_0$ is the frequency of the carrier wave and $e_j = 2.c_j - 1$. The signal received at the antenna of the receiver 15 is attenuated by a coefficient $\alpha$. The demodulator 16 derives the probability ratio for each bit, which may be expressed:

$$R_j = e_j + B_j$$

where the samples $B_j$ are the noise samples induced by the propagation channel, which are independent of the bits $c_j$, and not correlated with each other, with an average of 0 and with standard deviation $\sigma$, depending on the signal-to-noise ratio. The signal at the output of the demodulator 16 is then equal to:

$$R(t) = \sum_j R_j h(t - jT')$$

The channel decoder 17 next takes the decision relating to the bits sent by taking advantage of the channel coding used on sending in order to minimize the errors. Its output signal is given by:

$$Z(t) = \sum_j \hat{a}_j h(t - jT)$$

where the bits $\hat{a}_j$ are the decisions taken by the channel decoder. The source decoder 18 next reconstructs the analog signal $S(t)$ from the bits supplied by the channel decoder 17.

The invention resides principally in the channel coder 12 and the channel decoder 17. Thus it will be understood that it is compatible with various types of source coding/decoding, of modulation/demodulation and of propagation channels. In particular, the invention can be applied in the context of digital television. The coder 11 and the decoder 18 can then be produced according to a MPEG (moving picture expert group) standard, for example, and the modulator 13 and the demodulator 16 are matched to the propagation channel used (radio, wire, etc.). Another application example is facsimile transmission.

The block code applied by the channel coder 12 is a product code obtained from systematic elementary codes. In the embodiment described below, it is the product of two linear block codes $C_1$, $C_2$ with respective parameters $(n_1, k_1, d_1)$ and $(n_2, k_2, d_2)$.

Figure 2:
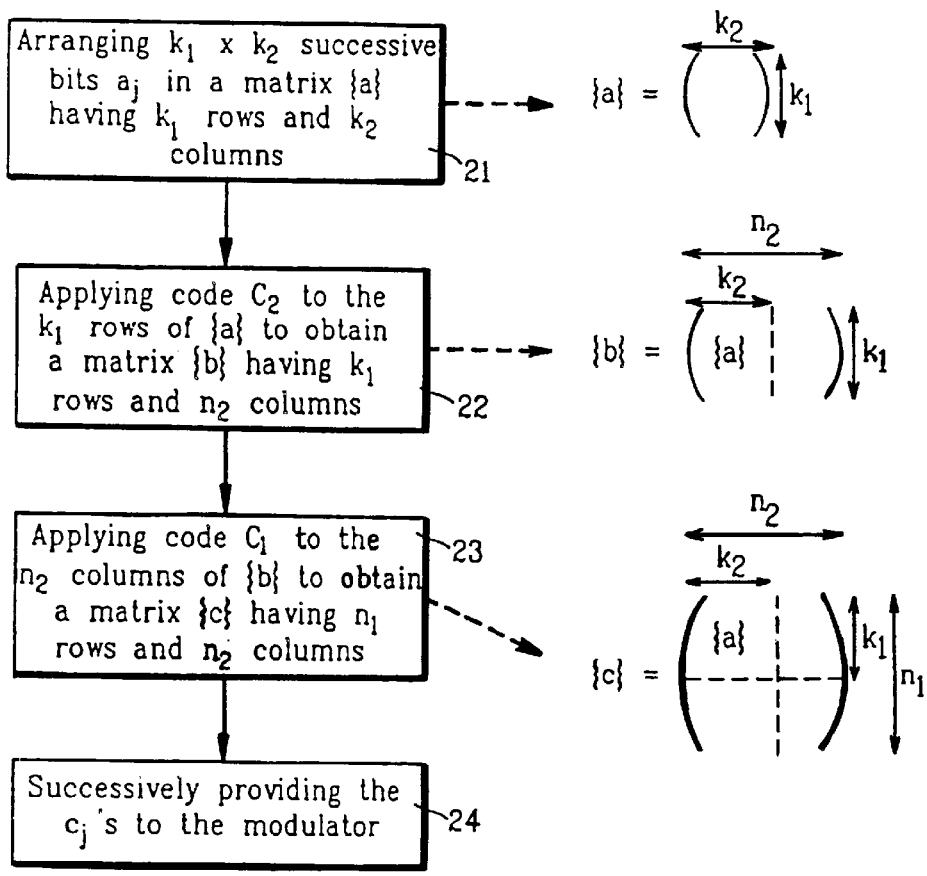
FIG. 2 is a flowchart illustrating the application of a product code.

The coding procedure, carried out with conventional coding circuits, is illustrated in FIG. 2. The bits $a_j$ received successively from the source coder 11 are first of all held, by groups of $k_1$ H $k_2$ bits, according to a matrix $\{a\}$ with $k_1$ rows and $k_2$ columns (step 21). The block code $C_2$ is then applied to each of the $k_1$ rows of the matrix $\{a\}$, which supplies a matrix $\{b\}$ with $k_1$ rows and $n_2$ columns (step 22). As the code $C_2$ is systematic, $k_2$ of the $n_2$ columns of the matrix $\{b\}$ are identical to the matrix $\{a\}$, for example the first $k_2$ columns. Next (step 23), the block code $C_1$ is applied to each of the $n_2$ columns of the matrix $\{b\}$, which supplies a matrix $\{c\}$ with $n_1$ rows and $n_2$ columns, the $c_j$ components of which are the bits transmitted successively to the modulator 13 in the form of the signal $Y(t)$ (step 24). As the code $C_1$ is systematic, $k_1$ of the $n_1$ rows of the matrix $\{c\}$ are identical to the matrix $\{b\}$, for example the first $k_1$ rows. Thus, the upper left part, of $k_1$ rows and $k_2$ columns, of the matrix $\{c\}$ is identical to the matrix $\{a\}$, the other components of the matrix $\{c\}$ being redundancy bits. All the columns of the matrix $\{c\}$ are code words of the code $C_1$. Likewise, all the rows of the matrix $\{c\}$ are code words of the code $C_2$, given that the elementary codes are linear.

Figure 3:
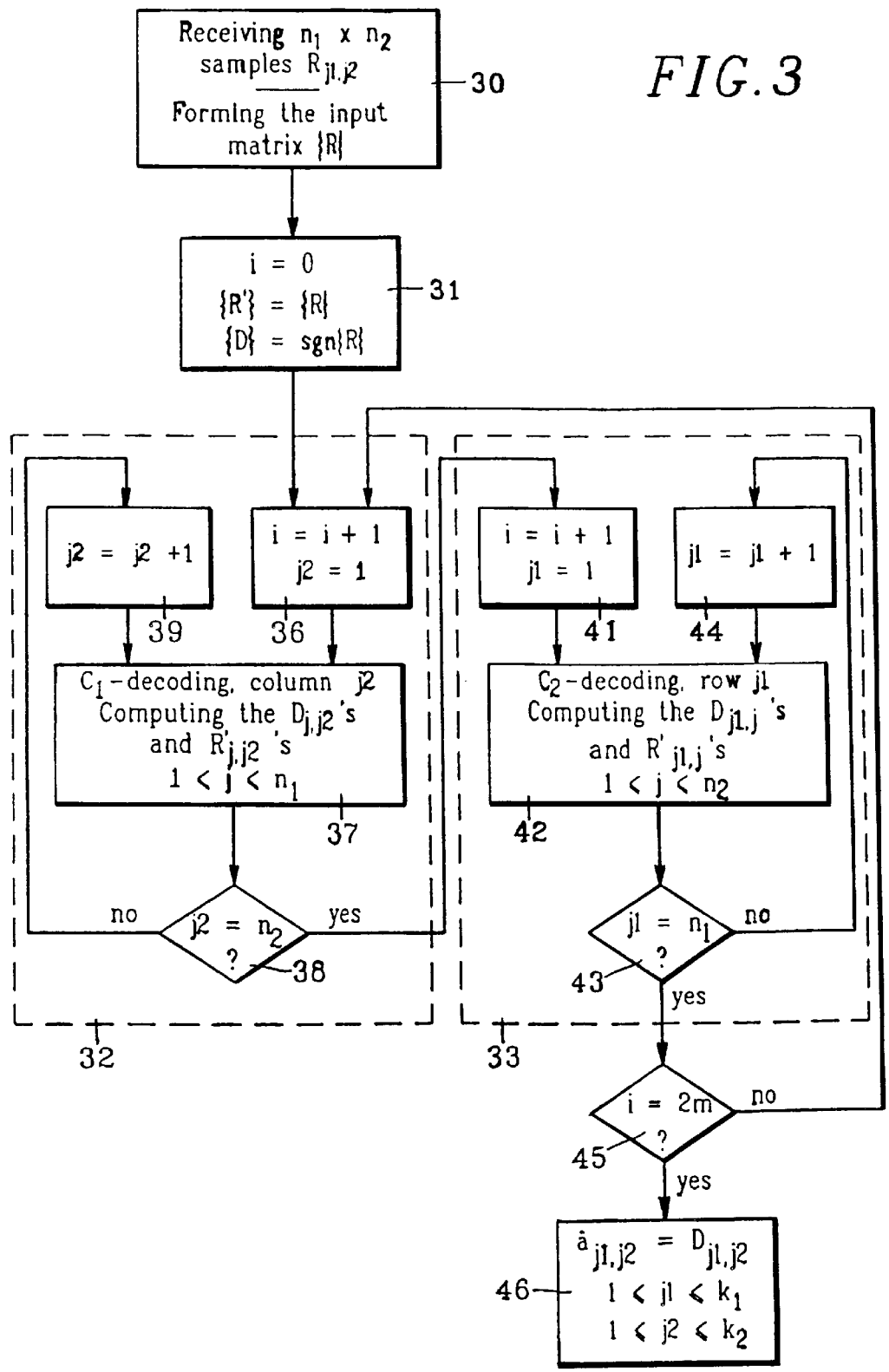
FIG. 3 is a general flowchart of an iterative decoding phase which can be used according to the invention.

The channel decoder 17 applies an iterative decoding procedure, the general flow chart for which is presented in FIG. 3. After receiving a block of $n_1 \times n_2$ samples $R_{j_1, j_2}$ ($1 \leq j_1 \leq n_1$, $1 \leq j_2 \leq n_2$) of the signal $R(t)$ received from the demodulator 16, which corresponds to the sending of a coded block formed by the channel coder 12, these samples are held in an input matrix {R} with $n_1$ rows and $n_2$ columns (step 30).

The decoding of this block of $n_1 \times n_2$ samples is initialized (step 31) by initializing the counting variable i to 0, by forming a data matrix {R'} with $n_1$ rows and $n_2$ columns, the components of which are initially the same as those of the input matrix {R}, and by forming a decision matrix {D} with $n_1$ rows and $n_2$ columns, the components of which are binary (−1 or +1) and, initially, each represent the sign of the corresponding component of the input matrix {R}: $D_{j1,j2}$= sgn $(R_{j1,j2})=\pm 1$.

After this initialization, the iterative decoding includes a number m of decoding cycles. Each decoding cycle successively includes a step 32 of search for words of the code $C_1$ in the columns of the data matrix, and a step 33 of search for words of the code $C_2$ in the rows of the data matrix.

At each search step 32 or 33, new values of the components of the decision matrix {D} and of the data matrix {R'} are calculated, which are used for the following search step. Each search step 32 or 33 can be seen as a filtering applied to the data matrix {R'} to reduce the incidence of the noise samples $B_{j1,j2}$ on the components $R'_{j1,j2}$ of this matrix.

The steps 32 and 33 are essentially identical if the role of the rows and of the columns of the matrices are exchanged. On initialization 36 of the search step 32, the counting variable i is incremented by one unit, and the column index $j_2$ is initialized to 1. A decoding is perform-ed, according to the code $C_1$, of the data word corresponding to the $j_2$-th column of the matrix {R'} (step 37), which supplies new values of the components $D_{j,j2}$ and $R'_{j,j2}$ of the matrices {D} and {R'} ($1 \leq j \leq n_1$). The decoding step 37 is followed by a comparison 38 between the column index $j_2$ and the number of columns $n_2$. When $j_2$ remains lower than $n_2$, the index $j_2$ is incremented by one unit (step 39), then the decoding step 37 is repeated. When $j_2$ becomes equal to $n_2$, all the columns having been processed, the other code word search step 33 of the decoding cycle in progress is commenced. On initialization 41 of the search step 33, the counting variable i is incremented by one unit, and the row index $j_1$ is initialized to 1. Decoding is performed, according to the code $C_2$, of the data word corresponding to the $j_1$-th row of the matrix {R'} (step 42), which supplies new values of the components $D_{j1,j}$ and $R'_{j1,j}$ of the matrices {D} and {R'}. The decoding step 42 is followed by a comparison 43 between the row index $j_1$ and the parameter $n_1$ of the code $C_1$. When $j_1$ remains less than $n_1$, the index $j_1$ is incremented by one unit (step 44), then the decoding step 42 is repeated. When $j_1$ becomes equal to $n_1$, the code word search step 33 is terminated, and the counting variable i is compared to 2m (test 45). When i remains less than 2m, the search step 32 is reentered to commence the following decoding cycle. When i becomes equal to 2m, the m decoding cycles having been accomplished, the $k_1 \times k_2$ decoded information bits $\hat{a}_{j1,j2}$ are extracted from the decision matrix {D} produced during the last code word search step 33. With the systematic codes $C_1$, $C_2$ applied in the way described above with reference to FIG. 2, the $\hat{a}_{j1,j2}$'s can simply be recovered in the first $k_1$ rows and the first $k_2$ columns of the matrix {D}: $\hat{a}_{j1,j2}=D_{j1,j2}$ ($1 \leq j1 \leq k_1$, $1 \leq j2 \leq k_2$). These $\hat{a}_{j1,j2}$'s have the values −1 or +1; they can easily be converted to assume the values 0 or 1.

Figure 4:
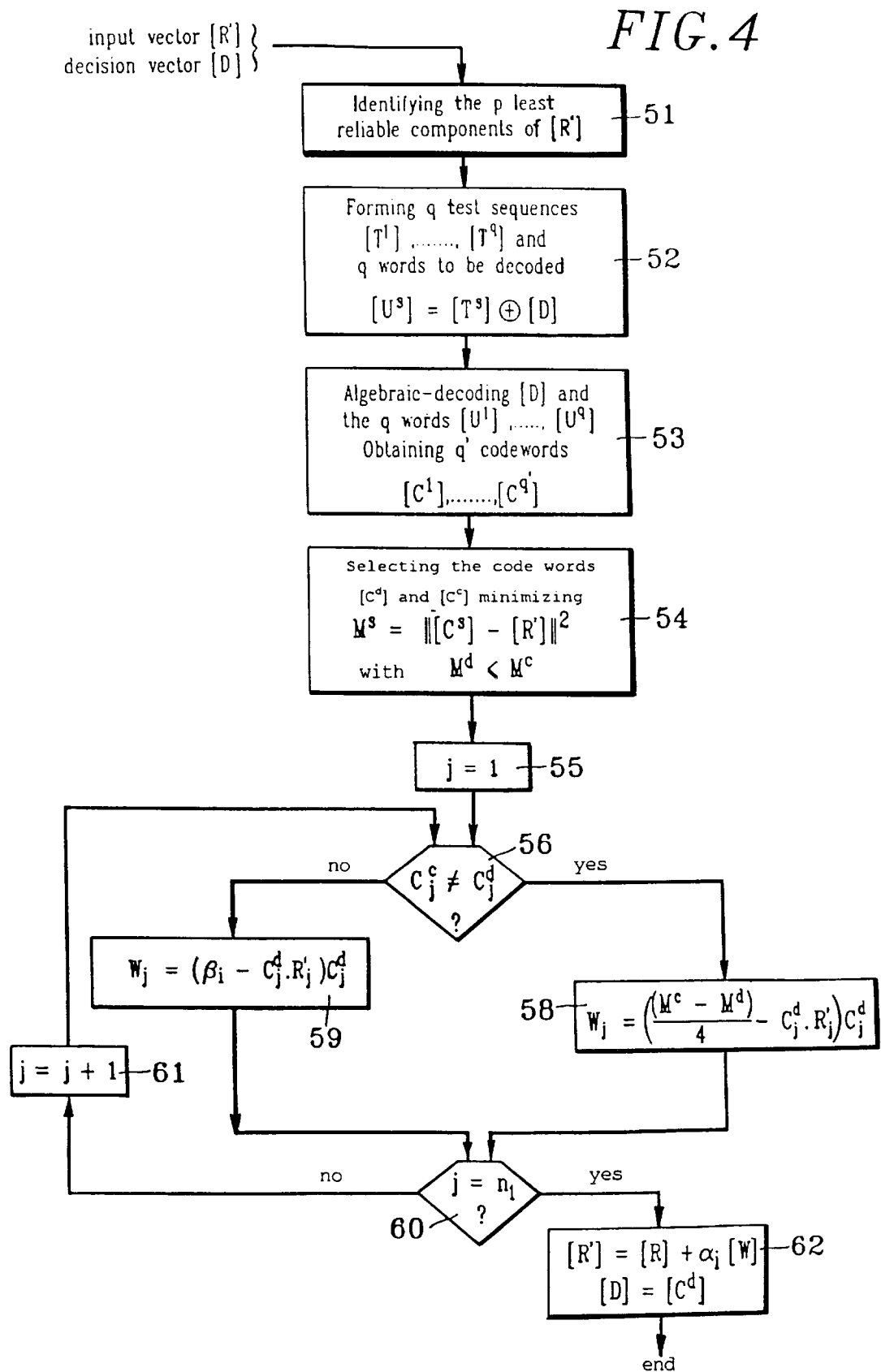
FIG. 4 is a flowchart detailing an elementary decoding step for a row or a column.
Figure 5:
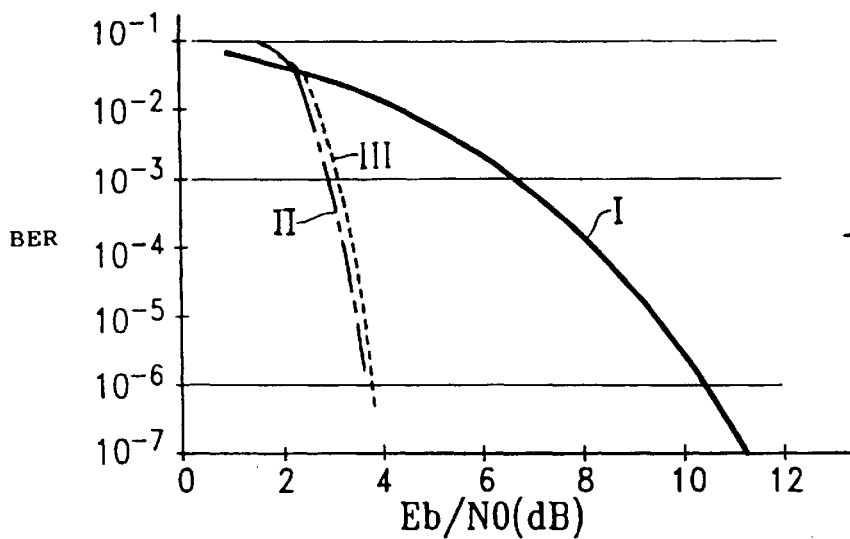
FIG. 5 is a graph illustrating the performance of the iterative decoding according to FIGS. 3 and 4.

The step 37 of decoding of a data word corresponding to a column of the data matrix, in a first implementation of the invention, is detailed on the flow chart of FIG. 4. During this step 37, a data vector [R'] and a decision vector [D], of length $n_1$, are processed, respectively constituting subdivisions of the data matrix {R'} and of the decision matrix {D}: $R'_j = R'_{j,j2}$ and $D_j = D_{j,j2}$ ($1 \leq j \leq n_1$). First of all (step 51) the p least reliable components of the vector [R'], that is to say the components of [R'] which are closest to the binary decision threshold (zero), are marked. The indices corresponding to these p least reliable components are denoted r1, r2, ... ,rp, with $|R'_{r1}| < |R'_j|$ $\forall j \neq r1$ $|R'_{r2}| < |R'_j|$ $\forall j \neq r1, r2$ etc.

Having identified these p indices, q binary test sequences $[T^1]$, ... ,$[T^q]$, of length $n_1$, are constructed, then q binary words to be decoded $[U^1]$, ... ,$[U^q]$ of length $n_1$, by combining each of the q test sequences with the decision vector [D] (step 52). Each word $[U^s]$ is constructed in such a way that all its components other than those corresponding to the p indices r1, ... ,rp are equal to the corresponding components of the decision vector [D]: $U^s_j = D_j$ for $j \neq r_1, \ldots$ ,rp. It generally suffices to take into account words $[U^s]$ which have only one or two components different from the corresponding components of the vector [D]. All these words are taken into account when $q = p(p+1)/2$. By way of example, when p=6 and q=21, the sequences $[T^s]$ and $[U^s]$ ($1 \leq s \leq q$) can be constructed in the following way:

the p=6 first test sequences $[T^s]$ have one bit equal to +1 in position rs and bits equal to −1 at the other positions: $T^s_{rs}=+1$ et $T^s_j=-1$ for $1 \leq s \leq 6$ and $j \neq rs$;

| | |
|---|---|
| $[T^7] = [T^1] \oplus [T^2]$ | $[T^{15}] = [T^2] \oplus [T^6]$ |
| $[T^8] = [T^1] \oplus [T^3]$ | $[T^{16}] = [T^3] \oplus [T^4]$ |
| $[T^9] = [T^1] \oplus [T^4]$ | $[T^{17}] = [T^3] \oplus [T^5]$ |
| $[T^{10}] = [T^1] \oplus [T^5]$ | $[T^{18}] = [T^3] \oplus [T^6]$ |
| $[T^{11}] = [T^1] \oplus [T^6]$ | $[T^{19}] = [T^4] \oplus [T^5]$ |
| $[T^{12}] = [T^2] \oplus [T^3]$ | $[T^{20}] = [T^4] \oplus [T^6]$ |
| $[T^{13}] = [T^2] \oplus [T^4]$ | $[T^{21}] = [T^5] \oplus [T^6]$ |
| $[T^{14}] = [T^2] \oplus [T^5]$ | | where $\oplus$ designates the exclusive OR operation, component by component, between two vectors:

$[U^s] = [T^s] \oplus [D]$ for $1 \leq s \leq q$

At the following step 53, algebraic decoding of the decision vector [D] and of the q words $[U^s]$ is performed. For this algebraic decoding, in the case of BCH codes, a Berlekamp decoder is used, for example, which is well known in the field of block coding (see E. R. Berlekamp, "Algebraic Coding Theory", McGraw-Hill, New York, 1968). The q+1 elementary decodings supply q' code words $[C^1]$, ... ,$[C^{q'}]$ of the code $C_1$. In the general case, $q' \leq q+1$, since, on the one hand, certain code words may appear several times in the decoding results, and, on the other hand, the algebraic decoder may not find certain code words if the signal is very distorted. The words supplied as results of the algebraic decoding thus have to be checked in order to determine whether they do or do not constitute words of the code $C_1$. This checking can be performed simply by multiplying each word obtained by the parity check matrix relative to the code $C_1$, and by eliminating the word if the result of the multiplication is not zero. However, in the case in which the code $C_1$ is perfect (that is to say that no word of $n_1$ bits is spaced from all the possible code words by more than $(d_1-1)/2$, which is the case particularly for the Hamming codes), the step of checking the results from the algebraic decoder is pointless.

Among the q' code words found, the one [Cd] which exhibits the smallest euclidean distance $M^d = \|[C^d] - [R']\|^2$ with the data vector [R'] is selected (step 54). This word $[C^d]$ will constitute the next decision vector. As candidate code word [$C^c$] is also selected that which, among the q code words found except for the word [$C^d$], has the shortest euclidean distance $M^c=\|[C^c]-[R']\|^2$ from the data vector [R']. This candidate word will be the only one which can be used as concurrent word for the calculation of confidences associated with the different bits of the word [$C^d$].

Next a loop is performed for calculation from the components $W_j$ of a correction vector [W] ($1 \leq j \leq n_1$). At the beginning of this loop (step 55), the index of component index j is initialised to 1. At each iteration in this loop, a test step 56 is carried out to determine if the j-th component of the candidate word [$C^c$] is different from that of the selected code word [$C^d$] ($C_j^c \neq C_j^d$). If so, the candidate code word [$C^c$] is a concurrent word with respect to the j-th component. The component $W_j$ is then calculated at step 58 according to the formula:

$$W_j = \left(\frac{M^c - M^d}{4} - C_j^d \cdot R_j'\right) \cdot C_j^d$$

It will be observed that the quantity $M^c-M^d$ occurring in this formula is always positive, so that $|M^c-M^d|=M^c-M^d$. If the test step 56 reveals that $C_j^c=C_j^d$, i.e. if no concurrent word can be determined, the component $W_j$ is calculated at step 59 according to the formula:

$$W_j = (\beta_i - C_j^d \cdot R_j') \cdot C_j^d \quad (2)$$

where βi designates a positive confidence coefficient. After calculation of the correction component $W_j$, the component index j is compared to the length $n_1$ of the vector [R'] (step 60). When j remains lower than $n_1$, the index j is incremented by one unit (step 61), and the following iteration is performed, starting with the test 56.

When j becomes equal to $n_1$, the loop is terminated, and the decoding step 37 terminates with the updating 62 of the data vector [R'] and of the decision vector [D]. The new vector [R'] is taken to be equal to the sum of the input vector [R] (each component $R_j$ of which is extracted from the input matrix {R}: $R_j=R_{j,j2}$), and from the correction vector [W] multiplied by another positive confidence coefficient $\alpha_i$: [R']=[R]+$\alpha_i$[W]. The new decision vector [D] is taken to be equal to the code word [$C^d$] selected at step 54.

In an execution variant, the formula (2) applied where appropriate at step 59 is replaced by:

$$W_j = \beta_i C_j^d \quad (2')$$

which procures a correction $W_j$ directly proportional to the sign of the new decision $C_j^d$. Other formulae making use of a confidence coefficient could also be used when no concurrent word is identified.

The steps 42 of decoding of data words corresponding to rows of the data matrix are similar to the steps 37 detailed above with reference to FIG. 4, by replacing the code $C_1$ by the code $C_2$, and the length $n_1$ by the length $n_2$, and by dividing the matrices {R'}, {D}, {R} not into column vectors [R'], [D], [R], but into row vectors.

The confidence coefficients $\alpha_i$ and $\beta_i$ are assigned an index corresponding to the counting variable i shown in the flowchart in FIG. 3. Indeed, these coefficients $\alpha_i$, $\beta_i$ can vary from one search step 32, 33 to another. The $\alpha_i$ and $\beta_i$ values preferably increase as the code word search steps 32, 33 progress, to reflect the increasing reliability of the decoding.

As an illustration of the performances of the decoding process illustrated above, FIG. 5 shows BER curves as a function of the signal to noise ratio Eb/NO obtained by simulation in the case of the product of two identical elementary codes BCH(64,57,4). In this case, the elementary decoder used to decode the lines and columns (steps 37,42), necessitates approximately 43000 logic gates when decoding conforms to the optimum version described in EP-A-0 654 910. Among these 43000 gates, 25000 are used for calculation of the correction vector [W], i.e. 59% of the circuit. With the elementary decoding illustrated in FIG. 4, the number of gates used for the calculation of [w] is divided by 10. The elementary decoder can thus be implemented with approximately 20500 gates instead of 43000. The results in FIG. 5 were obtained in the case of modulation by quadrature phase shift keying (QPSK) and of an additive white Gaussian noise channel, the data being quantified over 4 bits. m=4 decoding cycles were applied with q=16 test sequences built from the p=4 least weak components of the data vector [R']. During the 2m=8 code word search steps, the successive values of the coefficient $\alpha_i$ were 0.4, 0.4, 0.5, 0.5, 0.6, 0.6, 0.65, 0.65, while the coefficient $\beta_i$ remained constant: $\beta_i$=7. The curve II shows the results obtained by applying the optimum version of the decoding process according to EP-A-0 654 910. The curve III shows the corresponding results in the case of elementary decoding according to FIG. 4. For comparison, curve I shows the performances observed in the absence of channel coding. It is observed that the degradation of performances brought about by the simplification of the elementary decoding remains less than 0.15 dB for a BER of $10^{-5}$. This degradation is slight if weighed against the 50% gain in terms of circuit complexity. The implementation of a larger number of iterations can be envisaged, using the same elementary circuit, thus entailing an additional reduction in the overall complexity of the circuit.

Figure 6:
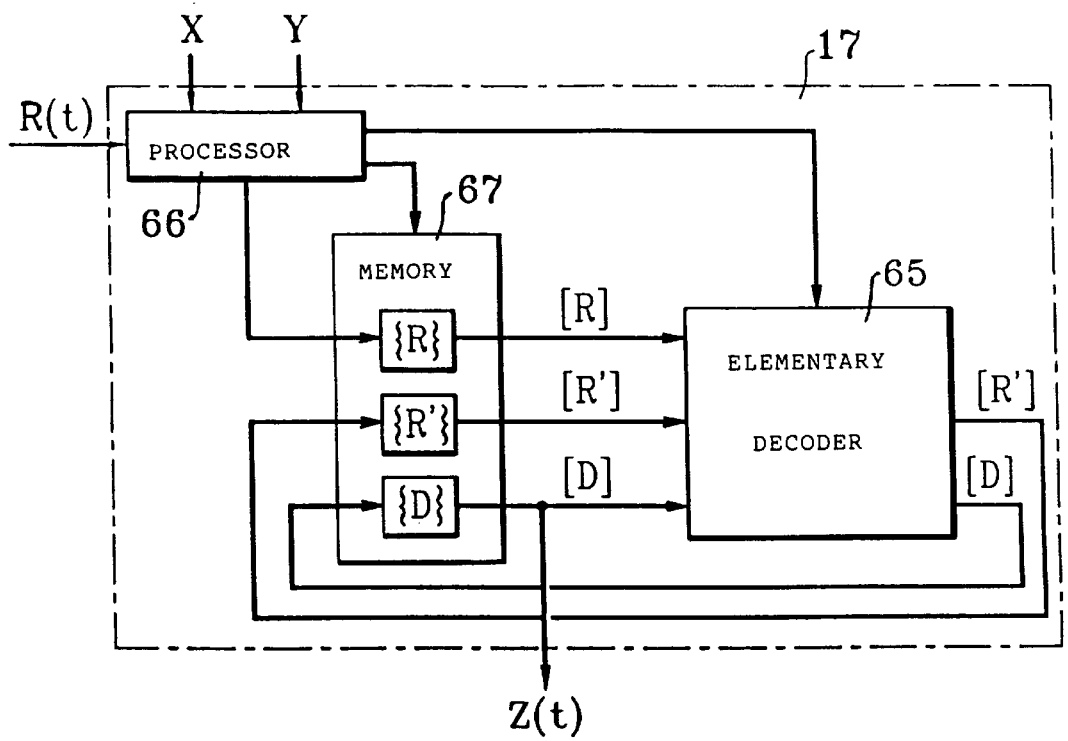
FIGS. 6 and 7 are respective block diagrams of a channel decoding circuit and a channel coding circuit according to the invention.

FIG. 6 shows an architecture of a BTC circuit 17 suitable for carrying out the decoding of the product code according to an algorithm such as that described above, in the specific case where the elementary codes used are identical. Each of the elementary decoding steps according to FIG. 4 is executed by a dedicated arithmetic and logic circuit 65 controlled by a control processor 66 on the BTC circuit (it would also be possible for several circuits 65 to be used to carry out several elementary decodings in parallel). A RAM memory 67 is used to store the samples of the matrices {R}, {R'} and {D}.

The processor 66 supervises the decoding according to the general flowchart in FIG. 3. On receipt of the samples of the signal R(t), the processor 66 orders writing to the memory 67 in order to form the input matrix {R} (step 30) and store it at the appropriate addresses, and to build the matrices {R'} and {D} (step 31) and store them at the appropriate addresses. At each elementary decoding 37 or 42, the processor orders read operations from the memory 67 to supply the appropriate samples for the vectors [R'], [D] and [R] to the elementary decoder 65, then write operations to record the new values for these vectors [R'] and [D]. At the end of the m cycles, the processor 66 executes step 46, ordering read operations at the appropriate addresses in the memory 67 (matrix {D}) in order to issue the output signal Z(t) of the decoder 17.

The invention allows various product code parameters to be varied while using the same BTC circuit 17 for the decoding: all that is required is for the appropriate parameters to be supplied to the part of the program of the processor 66 which relates to the formation of the input matrix {R} at step 30, and optionally to the part which relates to the extraction of the information bits at step 46.

Figure 7:
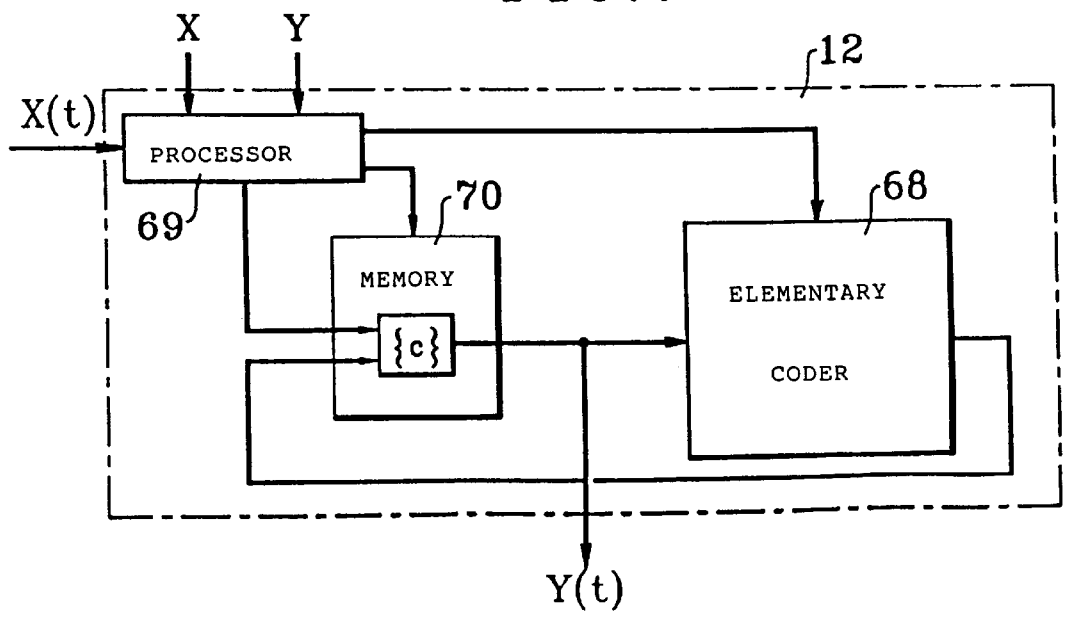

Programming also occurs with respect to the coder 12, of which FIG. 7 shows a block diagram in the specific case where the elementary codes used are identical. A conventional arithmetical circuit 68 is used for successive elementary codings of the lines and columns of the matrix of bits to be transmitted (steps 22 and 23 of FIG. 2). This elementary coder 68 is controlled by a control processor 69 of the coder. A RAM memory 70 is used to store the samples of the matrix $\{c\}$.

On receipt of a block of binary samples of the signal X(t) (here labelled $a_u$ for u=1,2, . . . ,k−X where k=$k_1$. $k_2$), the processor 69 orders write operations in the memory 70 in order to form the matrix $\{a\}$ with $k_1$ lines and $k_2$ columns, which is a sub-matrix of the matrix $\{c\}$ owing to the systematic coding (step 21). On each elementary coding, the processor 69 orders read operations in the memory 70 to supply the coder 68 with the appropriate samples of the row or column to be coded, and write operations to record the values of the redundancy bits obtained. After the $n_1+n_2$ elementary codings, the bits of the final matrix $\{c\}$ are available in the memory 70, and the processor 69 orders read operations at the appropriate addresses in this memory in order to supply the signal Y(t) to the modulator. The binary samples of the signal Y(t) are here labelled $c_v$ for v=1, 2, . . . ,n−X−Y where n=$n_1.n_2$.

Programming of the coder and the decoder allows the application of a shortening technique and/or a puncturing technique to the product code.

In the case of shortening, programming consists in supplying the coder and the decoder with the number X which represents the difference between the number of bits k of the matrix $\{a\}$ to which the product code is applied and the number k−X of bits $a_u$ per block to be coded. From this number X, the coder determines X positions in the matrix $\{a\}$ for bits of determined value(s) (for example 0) which, when each block is processed, will be located in corresponding positions of the matrix $\{c\}$ and which will be excluded from the bits transmitted $c_v$. It also determines an order in which the bits $a_u$ of each block will be stored in the other positions of the matrix $\{a\}$.

Figure 8:
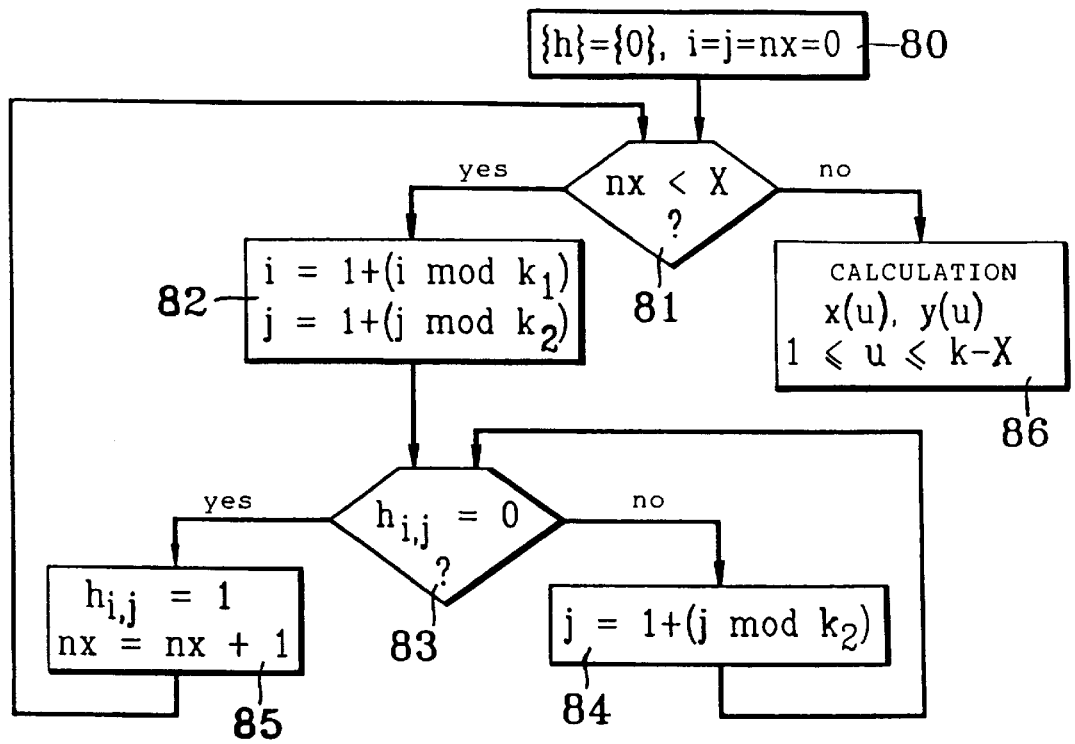
FIG. 8 is a flowchart of an allocation procedure which can be used for the shortening of a product code.

To determine these positions, the processors 69, 66 of the coder and the decoder apply a predefined procedure, such as for example the procedure the flowchart of which is shown in FIG. 8. In this example, a matrix $\{h\}$ with $k_1$ lines and $k_2$ columns designates, by $h_{i,j}=1$, the positions i,j of the known bits. Initially, all the components of the matrix $\{h\}$ are at 0, as are the indexes i,j and nx (step 80). The index nx is compared with X at step 81, and if nx<X, the indexes i and j are incremented by 1, respectively modulo $k_1$ and modulo $k_2$, at step 82 (in the notations used here, the indexes i and j are respectively included between 1 and $k_1$ and between 1 and $k_2$ such that the incrementation is carried out according to the formulae indicated in block 82 in FIG. 8). If $h_{i,j}\neq 0$ after step 82 (test 83), the column index j is incremented by 1 modulo $k_2$ at step 84 before the test 83 is repeated. When the test 83 shows that $h_{i,j}=0$, the value 1 is assigned to this component $h_{i,j}$ at step 85, and the index nx is incremented by 1 before returning to the comparison 81. All the positions are assigned when the comparison 81 shows that nx=X.

Figure 9:
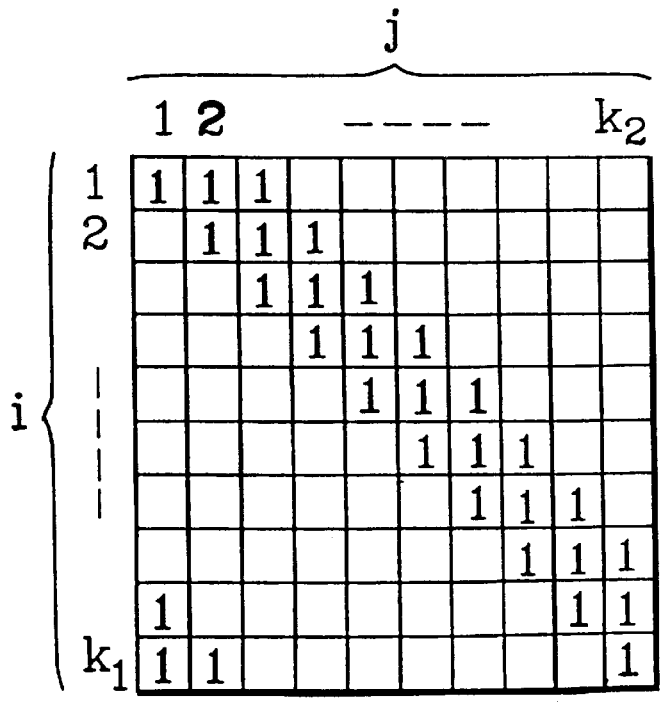
FIG. 9 is a diagram illustrating the results of the procedure in FIG. 8.

The above procedure allows uniform distribution of the positions of the known bits on the lines and the columns of the matrix $\{a\}$. The uniformity is perfect, that is, all the lines have the same number of $h_{i,j}=1$ positions as do all the columns, when X is a multiple of $k_1$ and of $k_2$; otherwise, deviations from uniformity are minimised. FIG. 9 illustrates one form of the matrix $\{h\}$ in the specific case where $k_1=k_2=10$ and X=30 (empty boxes corresponding to $h_{i,j}=0$).

After determining the X positions where $h_{i,j}=1$, the processors 69, 66 each calculate two tables x(u), y(u) ($1\leq u\leq$ k−X) respectively providing the row indexes and the column indexes for the positions of the matrix $\{a\}$ where the successive bits $a_u$ of each block to be coded will be stored. These tables are obtained at step 86 by assigning in a determined order the positions i, j of the matrix $\{a\}$ such as $h_{i,j}\neq 1$, for example row by row (i=1,2, . . . ,$k_1$) and, in each row in ascending order of the column indexes (j=1, 2, . . . ,$k_2$).

The procedure of FIG. 8 is carried out once on programming of the coder and the decoder, the tables x(u) and y(u) and the matrix $\{h\}$ then being retained in memory. For each block of bits $a_u$, the processor 69 of the coder 12 will build the matrix $\{a\}$ at step 21 according to:

$a_{i,j}=0$ if $h_{i,j}=1$ $a_{x(u),y(u)}=a_u$ for $1\leq u\leq$ k−X

In its output signal corresponding to a block, the coder 12 does not include the bits $c_{i,j}$ such as $h_{i,j}=1$ (step 24). In building the matrix $\{R\}$ at step 30, the processor 66 of the decoder 17 places in these positions samples $R_{i,j}$ the sign of which corresponds to the known value of the bit $a_{i,j}$ (for example −1 for $a_{i,j}=0$), and the absolute value M of which represents maximum confidence (typically the greatest of the quantification values of the decoder).

At the end of block decoding (step 46), the processor 66 extracts the estimations $\hat{a}_u$ (=±1) of the bits $a_u$, according to $\hat{a}_u=D_{x(u),y(u)}$.

As regards puncturing, programming consists in supplying the coder and the decoder with the number Y which represents the difference between the number n−X of unknown bits of the matrix $\{c\}$ resulting from the application of the product code (X=0 if no code shortening is carried out) and the number of bits n−X−Y transmitted by the coder for each information block. From this number Y, the coder determines Y positions in the matrix $\{c\}$ for bits which will be excluded from the transmitted bits $c_v$.

Figure 10:
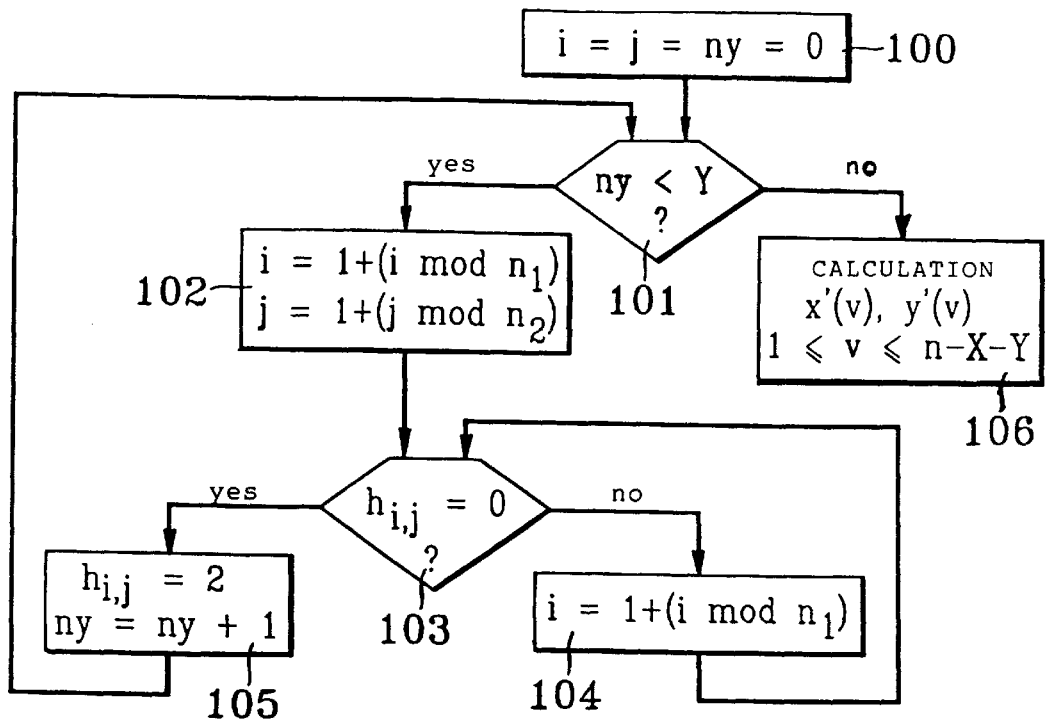
FIG. 10 is a flowchart of an allocation procedure which can be used for the puncturing of a product code.

To determine these positions, the processors 69, 66 of the coder and the decoder apply a predefined procedure, such as for example the procedure the flowchart of which is shown in FIG. 10, which is similar to that in FIG. 8. In this example, the dimensions of the matrix $\{h\}$ have been extended to $n_1$ lines and $n_2$ columns, and the Y positions i,j of the punctured bits are designated by $h_{i,j}=2$. Initially, all the components of the matrix $\{h\}$ are at 0, except those set to 1 by the procedure in FIG. 8 if X≠0, and the indexes i,j and ny (step 100). The index ny is compared with Y at step 101, and if ny<Y, the indexes i and j are incremented by 1, respectively modulo $n_1$ and modulo $n_2$, at step 102 (in the notations used here, the indexes i and j are respectively comprised between 1 and $n_1$ and between 1 and $n_2$ such that the incrementation is carried out according to the formulae indicated in block 102 in FIG. 10). If $h_{i,j}\neq 0$ after step 102 (test 103), the column index j is incremented by 1 modulo $n_2$ at step 104 before the test 103 is repeated. When the test 103 shows that $h_{i,j}=0$, the value 2 is assigned to this component $h_{i,j}$ at step 105, and the index nx is incremented by 1 before returning to the comparison 101. All the positions are assigned when the comparison 101 shows that ny=Y.

Figure 11:
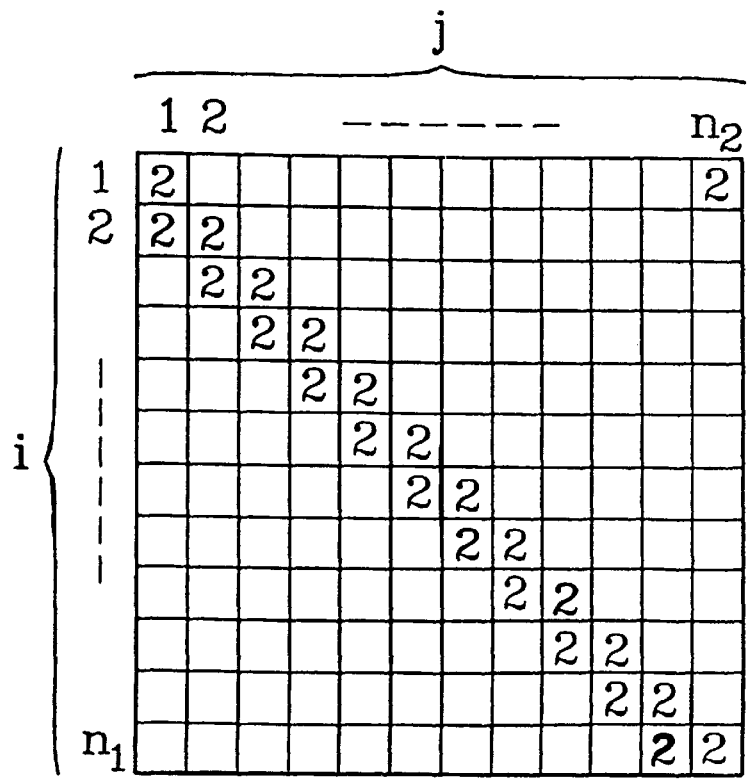
FIGS. 11 and 12 are diagrams illustrating the results of the procedure in FIG. 10.

The above procedure allows uniform distribution of the Y positions of the punctured bits on the lines and the columns of the matrix $\{c\}$. If there is no shortening, the uniformity is perfect when Y is a multiple of $n_1$ and $n_2$; otherwise, variations from uniformity are minimised. FIG. 11 illustrates one form of the matrix $\{h\}$ in the case where $n_1=n_2=12$ and Y=24 without shortening (empty boxes corresponding to $h_{i,j}=0$).

Figure 12:
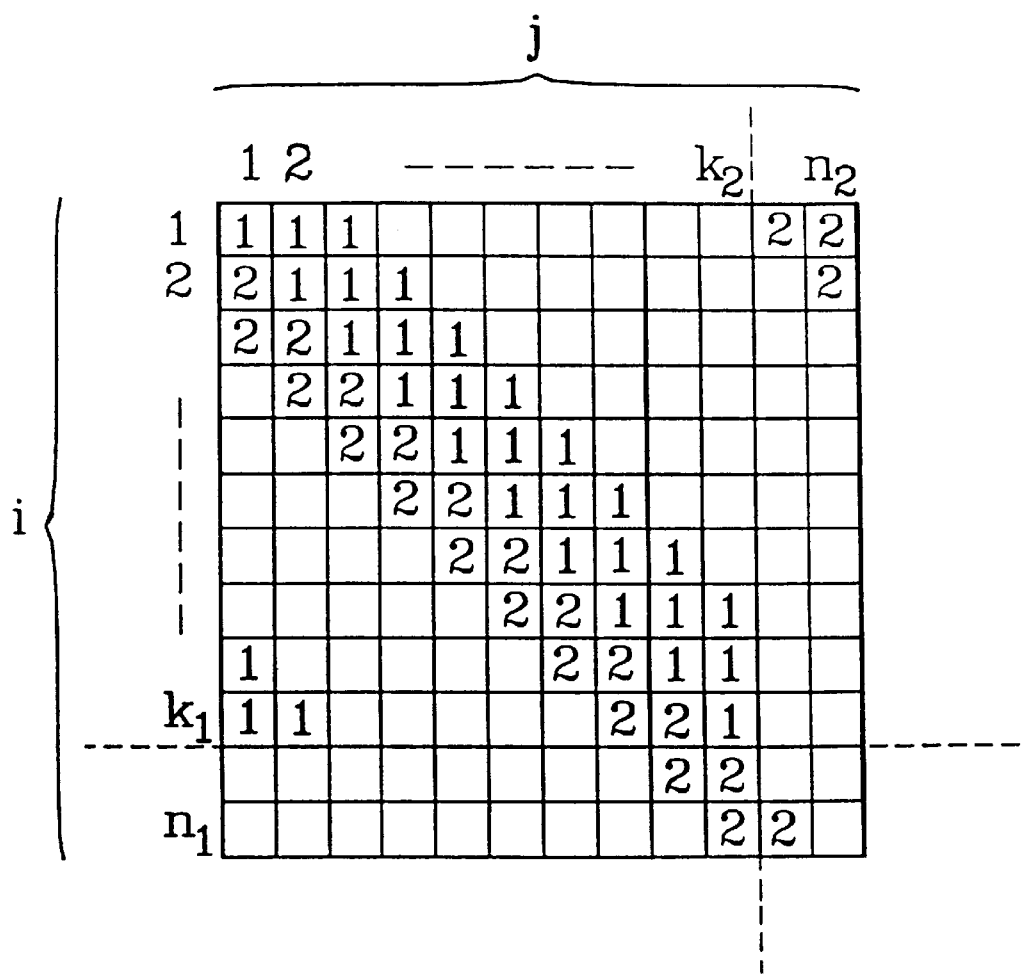

When shortening is used in conjunction with puncturing (X≠0 and Y≠0), the uniformity of the Y positions on the lines and columns of the matrix {c} is perfect in the case of square matrices ($k_1=k_2$ and $n_1=n_2$) if Y is a multiple of $n_1$; otherwise, the variations in uniformity remain very slight. FIG. 12 illustrates one form of the matrix {h} in the case where $k_1=k_2=10$, $n_1=n_2=12$, X=30 and Y=24. Only the n−X−Y=90 bits $c_{i,j}$ placed in the empty boxes in FIG. 12 are transmitted by the coder.

Transmission of the n−X−Y bits c, is carried out in a specific order, for example row by row, step 24 then consisting, for the coder, in carrying out:

$c_v = c_{x'(v),y'(v)}$ for $1 \leq v \leq n-X-Y$, the row and column indexes x' (v), y' (v) being determined and memorised on programming of the coder and the decoder, at step 106 (FIG. 10). Correspondingly, the processor 66 of the decoder 17 places the n−X−Y samples $R_v$ of the received signal block in the appropriate locations in the matrix {R} at step 30:

$R_{x'(v),y'(v)} = R_v$ for $1 \leq v \leq n-X-Y$.

In the other locations, the processor 66 places:

$R_{i,j} = -M$ if $h_{i,j}=1$ as indicated previously, $R_{i,j} = \pm \epsilon$ if $h_{i,j}=2$ The number $\epsilon$ represents a maximum confidence in the estimations of the Ys (typically the lowest of the decoder quantification values).

During the iterative decoding, the estimations $D_{i,j}$ of the bits such as $h_{i,j}=1$ will remain very low. Those relating to the punctured bits ($h_{i,j}=2$) will see their reliabilities increase as the elementary decodings progress.

Figure 13:
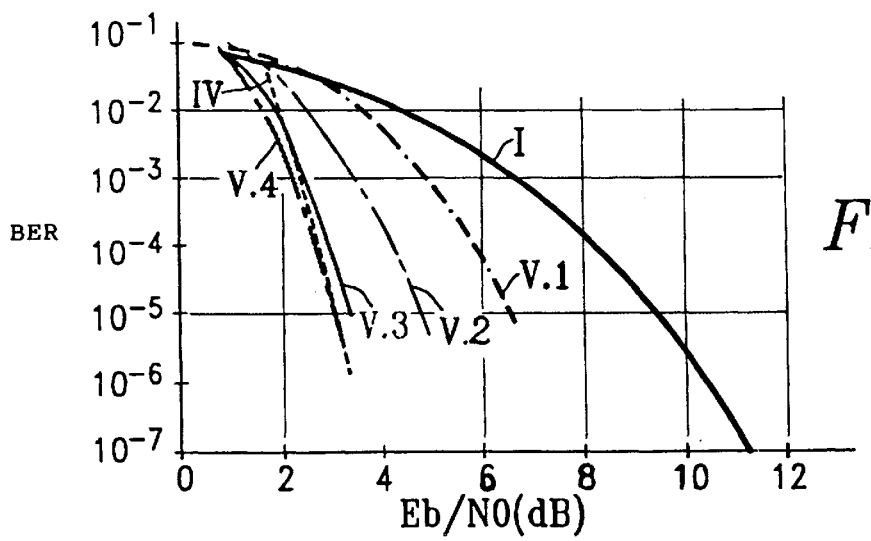
FIGS. 13 and 14 are graphs illustrating the performances of the iterative decoding applied to a shortened product code and to a punctured product code.
Figure 14:
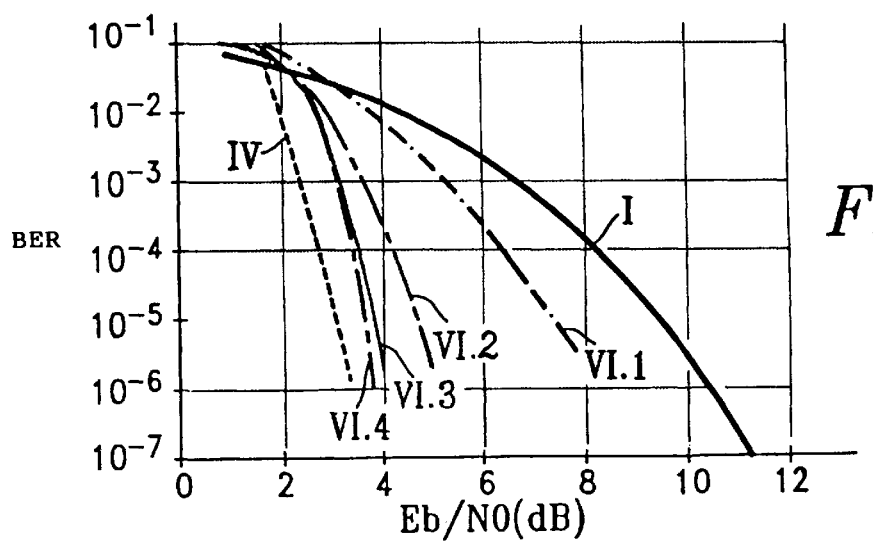

The performances of the shortening and puncturing techniques applied to a product code according to the invention are respectively illustrated by the FIGS. 13 and 14 in the case of the product of two identical elementary codes BCH (32,26,4), and of a modulation by quadrature phase shift keying (QPSK). The parameters of the product code are then:

k=676 n=1024 d=16 initial efficiency 0.660.

In FIGS. 13 and 14, the curve I shows the evolution of the binary error rate (BER) as a function of the signal/noise ratio $Eb/N_0$ in the absence of channel coding, and the curve IV with the product code applied without shortening or puncturing (X=Y=0) and with an iterative decoding in m=4 cycles.

FIG. 13 corresponds to the case where X=312, Y=0, that is, each block to be coded comprises k−X=364 information bits and the coding efficiency is (k−X)/(n−X)=0.511, the theoretical Shannon limit then being 0.04 dB. The curves V.1 to V.4 show the performances obtained after, respectively, m=1, m=2, m=3 and m=4 decoding cycles. It is observed that the gradient of the curve after 4 cycles is practically unchanged with respect to the case where k information bits are transmitted per block (curve IV). The signal to noise ratio needed to obtain a BER=$10^{-5}$ after 4 cycles is equal to 2.91 dB, which corresponds to approximately 2.9 dB above the Shannon limit. This solution makes a BTC circuit available which can transmit data blocks of any size, less than or equal to k, without any significant degradation of codec performances with respect to the theoretical Shannon limit.

FIG. 14 corresponds to the case where the same BTC circuit is programmed with X=0, Y=104, that is, each coded block comprises n−k−Y=244 redundancy bits instead of 348, and the coding efficiency is k/(n−Y)=0.735, the theoretical Shannon limit then being 0.81 dB. The curves VI.1 to VI.4 show the performances obtained after, respectively, m=1, m=2, m=3 and m=4 decoding cycles, in the case where the punctured bits are selected from the redundancy bits added by the systematic product code. It is observed that the gradient of the curve after 4 cycles is practically unchanged with respect to the case where the n bits of the matrix are transmitted (curve IV). The signal to noise ratio needed to obtain a BER=$10^{-5}$ after 4 cycles is equal to 3.71 dB, which corresponds to approximately 2.9 dB above the Shannon limit. This solution makes a BTC circuit available where any number of redundancy bits are used, less than or equal to n−k, without any significant degradation of codec performance with respect to the theoretical Shannon limit.

We claim:

1. Process for transmitting information bits, wherein a transmitter executes the following steps:

forming a first binary matrix from the information bits to be transmitted;

converting the first binary matrix into a second binary matrix by applying a systematic block code corresponding to a product of elementary systematic block codes; and transmitting bits extracted from the second binary matrix towards a channel, and a receiver executes the following steps:

forming an input matrix from a signal received according to said channel, the input matrix having the same size as the second binary matrix, and being comprised of digital samples having signs which represent respective initial estimations of the bits in the second binary matrix and absolute values which respectively measure confidences associated with said initial estimations; and iteratively decoding the input matrix, wherein the iterative decoding of the input matrix includes a number m of decoding cycles, each decoding cycle successively comprising code word search steps for each elementary block code used in the product code, wherein, at each code word search step, a data matrix and a decision matrix having binary components are received which, before the first search step of the iterative decoding are respectively constituted by the input matrix and by a matrix having binary components which respectively correspond to the signs of the input matrix samples, and a new decision matrix and a new data matrix are produced for the following search step, whereby the new decision matrix has binary components which represent new respective estimations of the bits of the second binary matrix and the new data matrix has samples having absolute values which respectively measure confidences associated with said new estimations, wherein decoded information bits are extracted from the decision matrix produced during the last code word search step, wherein each code word search step includes a division of the data matrix received into data vectors each corresponding to a code word of the elementary code and a corresponding division of the decision matrix received into decision vectors and soft decision elementary decodings to respectively process at least certain data vector/decision vector pairs, wherein the first binary matrix comprises, in addition to the information bits, a set of bits having values a priori known to the receiver, the bits of said set being distributed in a substantially uniform manner according to each dimension of the first binary matrix, whereby, after systematic coding, the bits of said set are located in determined positions of said second binary matrix, wherein the bits of said set are not transmitted towards the channel, and wherein the receiver places in the input matrix, in positions corresponding to said determined positions of the second binary matrix, samples having signs which correspond respectively to the a priori known values of the bits of said set and absolute values which are representative of a maximum confidence.

2. Process according to claim 1, wherein the soft decision elementary decoding for the processing of a data vector/decision vector pair comprises the following steps:

determining a number p of indexes for which the data vector components are the least reliable;

constructing a number of q of binary words to be decoded from said p indexes and from the decision vector;

obtaining q' code words on the basis of algebraic decodings of the decision vector and the q binary words to be decoded;

selecting, from the q' code words obtained, that having the shortest euclidean distance with the data vector;

calculating a correction vector, each component $W_j$ of the correction vector being respectively calculated by determining an optional concurrent word having a j-th component different from a j-th component of the selected code word, by applying the formula:

$$W_j = \left[\frac{|M^c - M^d|}{4} - C_j^d R'_j\right] C_j^d$$

when a concurrent word has been determined, $M^d$ and $M^c$ respectively designating the euclidean distances, with respect to the data vector, of the selected code word and of the concurrent word, and $C_j^d$ and $R'_j$ respectively designating the j-th components of the selected code word and of the data vector;

obtaining the new decision vector taken as equal to said selected code word; and calculating the new data vector by adding the correction vector multiplied by a first confidence coefficient to the corresponding input vector extracted from the input matrix.

3. Process according to claim 2, wherein, in the step of calculating a correction vector, the determination of an optional concurrent word with respect to the j-th component of the selected code word includes a comparison between the j-th component of the selected code word and the j-th component of a candidate code word which, among the q' code words obtained except for the selected code word, has the shortest euclidean distance with the data vector, said candidate code word being taken as a concurrent word when its j-th component is different from the j-th component of the selected code word, and no concurrent word being determined if not.

4. Process according to claim 2, wherein the calculation of each component $W_j$ of the correction vector in the absence of determination of a concurrent word with respect to said component $W_j$ is carried out according to the formula:

$$W_j = \beta_i C_j^d$$

where $\beta_i$ designates a second confidence coefficient.

5. Process according to claim 2, wherein the calculation of each component $W_j$ of the correction vector in the absence of determination of a concurrent word with respect to said component $W_j$ is carried out according to the formula:

$$W_j = [\beta_i - C_j^d R'_j] C_j^d$$

where $\beta_i$ designates a confidence coefficient.

6. Redundancy coder, comprising:

means to form a first binary matrix from information bits to be transmitted;

elementary coding means controlled to convert the first binary matrix into a second binary matrix by application of a systematic block code corresponding to a product of elementary systematic block codes;

means to transmit bits extracted from the second binary matrix towards a channel; and programming means to determine, from a number X supplied to program the number of information bits to be included in each first matrix, X positions uniformly distributed according to each dimension of the first matrix, wherein the means of forming the first matrix are designed to place bits of known values in said X positions, whereby said bits of known values are located after systematic coding in determined positions of the second binary matrix, and wherein said means to transmit do not include said bits of known values located at determined positions after systematic coding in the bits transmitted towards the channel.

7. Error correction decoder, comprising:

means for forming an input matrix from a signal received according to a transmission channel, the input matrix being composed of digital samples the signs of which represent respective initial estimations of bits of a binary matrix formed by a redundancy coder applying a systematic block code corresponding to a product of elementary systematic block codes and the absolute values of which respectively measure confidences associated with said initial estimations; and iterative decoding means controlled to decode the input matrix according to successive decoding cycles, each decoding cycle successively comprising steps for searching code words o each elementary block code used in the product code, wherein, at each code word search step, the decoding means receive a data matrix and a decision matrix having binary components which, before the first search step of the iterative decoding, are respectively constituted by the input matrix and a matrix having binary components which correspond to the signs of samples of the input matrix, and produce a new decision matrix and a new data matrix for the following search step, whereby the new decision matrix has binary components which represent new respective estimations of the bits of the second binary matrix and the new data matrix has samples having absolute values which respectively measure confidences associated with said new estimations, wherein decoded information bits are extracted from the decision matrix produced during the last step of the code word search, and wherein each code word search step includes a division of the data matrix received into data vectors each corresponding to a code word of the elementary code and a corresponding division of the decision matrix received into decision vectors and elementary soft decision decodings respectively process at least certain data vector/decision vector pairs, the error correction decoder further comprising programming means to determine, from a number X supplied to program the number of decoded information bits to be extracted from the decision matrix, X positions uniformly distributed according to each dimension of a non-redundant sub-matrix of said binary matrix, and wherein the means for forming the input matrix are designed to place, in positions corresponding to said X positions, digital samples of determined signs having absolute values representative of a maximum confidence.

* * * * *